(12) United States Patent
Rokubuichi et al.

(10) Patent No.: US 11,942,400 B2
(45) Date of Patent: Mar. 26, 2024

(54) SEMICONDUCTOR APPARATUS, MANUFACTURING METHOD FOR SEMICONDUCTOR APPARATUS, AND POWER CONVERTER

(71) Applicant: Mitsubishi Electric Corporation, Tokyo (JP)

(72) Inventors: Hodaka Rokubuichi, Tokyo (JP); Kei Yamamoto, Tokyo (JP); Kuniyuki Sato, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 358 days.

(21) Appl. No.: 17/429,946

(22) PCT Filed: Feb. 26, 2019

(86) PCT No.: PCT/JP2019/007322
§ 371 (c)(1),
(2) Date: Aug. 11, 2021

(87) PCT Pub. No.: WO2020/174584
PCT Pub. Date: Sep. 3, 2020

(65) Prior Publication Data
US 2022/0189859 A1    Jun. 16, 2022

(51) Int. Cl.
*H01L 23/495* (2006.01)
*H01L 23/31* (2006.01)

(52) U.S. Cl.
CPC ...... *H01L 23/49568* (2013.01); *H01L 23/315* (2013.01); *H01L 23/49575* (2013.01);
(Continued)

(58) Field of Classification Search
CPC ............. H01L 23/49568; H01L 23/315; H01L 23/49575; H01L 2224/48091; H01L 2224/48247; H01L 2924/183
See application file for complete search history.

(56) References Cited

U.S. PATENT DOCUMENTS

| 8,643,171 B1 | 2/2014 | Nakazato et al. |
| 2014/0252590 A1 | 9/2014 | Gohara et al. |

(Continued)

FOREIGN PATENT DOCUMENTS

| JP | 2001-274297 A | 10/2001 |
| JP | 2006-222461 A | 8/2006 |

(Continued)

OTHER PUBLICATIONS

German Office Action dated May 27, 2022, in German Application No. 11 2019 006 927.6.

(Continued)

*Primary Examiner* — Peniel M Gumedzoe
(74) *Attorney, Agent, or Firm* — XSENSUS LLP

(57) ABSTRACT

A semiconductor apparatus that ensures heat dissipation using a heat dissipating member with multiple fins formed by folding a metal plate, a manufacturing method for the semiconductor apparatus, and a power converter are obtained. The semiconductor device is bonded to a lead frame. The lead frame is provided on an insulating layer and a metal base plate is provided on the face opposite to the face of the insulating layer on which the semiconductor device is bonded. The semiconductor device, the lead frame, the insulating layer, and the metal base plate are sealed with a sealing member in such a way that a portion of the lead frame and a portion of the metal base plate are exposed. The exposed portion of the metal base plate exposed from the sealing member is inserted in an opening of a support frame. A heat dissipating member is bonded to both the metal base plate and the support frame.

20 Claims, 14 Drawing Sheets

(52) U.S. Cl.
CPC .............. *H01L 2224/48091* (2013.01); *H01L 2224/48247* (2013.01); *H01L 2924/183* (2013.01)

(56) References Cited

U.S. PATENT DOCUMENTS

2016/0225691 A1* 8/2016 Sanda .................. H01L 23/3672
2016/0300785 A1* 10/2016 Kimura ............... H01L 23/4334

FOREIGN PATENT DOCUMENTS

| | | |
|---|---|---|
| JP | 2012-49167 A | 3/2012 |
| JP | 2014-203978 A | 10/2014 |
| JP | 2016-174034 A | 9/2016 |
| WO | 2013/054615 A1 | 4/2013 |
| WO | 2014/020704 A1 | 2/2014 |

OTHER PUBLICATIONS

International Search Report and Written Opinion dated Apr. 9, 2019, received for PCT Application PCT/JP2019/007322, Filed on Feb. 26, 2019, 9 pages including English Translation.
Office Action dated Jan. 8, 2024, in Chinese Application No. 201980092703.2, 18 pages.

* cited by examiner

SEMICONDUCTOR APPARATUS, MANUFACTURING METHOD FOR SEMICONDUCTOR APPARATUS, AND POWER CONVERTER

CROSS-REFERENCE TO RELATED APPLICATION

The present application is based on PCT filing PCT/JP2019/007322, filed Feb. 26, 2019, the entire contents of which are incorporated herein by reference.

TECHNICAL FIELD

The present disclosure relates to a semiconductor apparatus including a heat dissipating member with multiple fins, a manufacturing method for the semiconductor apparatus, and a power converter.

BACKGROUND ART

Conventionally, a semiconductor apparatus has been known in which a plurality of semiconductor devices is mounted on a circuit board, a lead frame, or the like, and the entire semiconductor device is integrated with a sealing member. However, in general, such a semiconductor apparatus is subject to a large amount of heat from the semiconductor devices. Therefore, a metal base plate for heat dissipation, such as a heat spreader, is provided in contact with an insulating layer on which the circuit board and the lead frame are placed. In addition, a heat dissipating member on which multiple fins are arranged is attached to the surface of the metal base plate of the semiconductor apparatus. Grease is usually applied between the metal base plate and the heat dissipating member to reduce the contact thermal resistance. However, the thermal conductivity of the grease is far lower than that of metal and, in addition, a phenomenon called "pumping out" in which the grease flows out due to the heat cycle occurs to make the heat dissipation worse. As a countermeasure to this, methods of bonding the heat dissipating member without using grease are being studied.

For example, in Patent Document 1, grooves are formed in the face opposite to the face of the metal base plate on which a power semiconductor device is placed, and a heat dissipating member is fixed to the grooves of the metal base plate by caulking. However, if the heat dissipating member is to be fixed to the metal base plate by caulking in a way described above, complex processing such as formation of the grooves and related processing are required on the metal base plate.

In Patent Document 2, a heat sink including a folding fin formed by folding a metal plate and a base plate bonded to the folding fin is provided, and the heatsink is bonded to a conductor layer of an insulating substrate using a bonding metal. The use of the folding fin contributes to reduction of heat capacity compared to conventional fins of the same volume, ease of thermal bonding such as solder bonding, and elimination of complex processing such as grooving.

In order to efficiently dissipate heat from the semiconductor device, the number of fins needs to be increased and a large heat dissipating member needs to be attached to the metal base plate. Meanwhile, in the case of the semiconductor apparatus in which the sealing member is formed by a transfer mold method or the like, the metal base plate should preferably be sealed integrally with a semiconductor device and other components in order to ensure their bonding reliability, so that the size of the metal base plate is naturally constrained by the size of the mold at the molding.

CITATION LIST

Patent Documents

Patent Document 1: Japanese Unexamined Patent Publication No. 2012-49167
Patent Document 2: Japanese Unexamined Patent Publication No. 2016-174034

SUMMARY OF INVENTION

Problems to be Solved by Invention

However, when the width of the bonding face of a heat dissipating member with multiple fins formed by folding a metal plate exceeds the width of the metal base plate, the folded shapes cannot be maintained, a problem arises in that the heat dissipation is degraded.

The present invention is made to solve the problem described above and aims to provide a semiconductor apparatus that ensures heat dissipation using a heat dissipating member with multiple fins formed by folding a metal plate, a manufacturing method for the semiconductor apparatus, and a power converter.

Means for Solving the Problems

A semiconductor apparatus according to the present disclosure includes: a semiconductor device; a lead frame to which the semiconductor device is bonded; an insulating layer on which the lead frame is provided; a metal base plate provided on a face of the insulating layer opposite to a face on which the lead frame is provided; a sealing member to seal the semiconductor device, the lead frame, the insulating layer, and the metal base plate in such a way that a portion of the lead frame and at least one portion of the metal base plate are exposed; a support frame having at least one opening in which the at least one exposed portion of the metal base plate exposed from the sealing member is inserted; and a heat dissipating member that is provided with multiple fins formed by folding a metal plate and that is welded to a part of the at least one exposed portion of the metal base plate inserted in the at least one opening and to the support frame.

A manufacturing method for a semiconductor apparatus according to the present disclosure includes: bonding a semiconductor device to a lead frame; forming a sealing member, after stacking in a mold, a metal base plate, an insulating layer, and the lead frame to which the semiconductor device is bonded, to seal the semiconductor device, the lead frame, the insulating layer, and the metal base plate in such a way that a portion of the lead frame and a portion of the metal base plate are exposed from the sealing member; and welding a heat dissipating member having multiple fins formed by folding a metal plate to both a part of the exposed portion inserted into the opening and the support frame after inserting the exposed portion of the metal base plate exposed from the sealing member into the opening of the support frame.

A power converter according to the present disclosure includes: a main conversion circuit including a semiconductor apparatus to convert inputted electric power and output the converted electric power; a control circuit to output to the main conversion circuit, a control signal for controlling the main conversion circuit.

Effect of Invention

In the semiconductor apparatus and the power converter according to the present disclosure, the exposed portion of the metal base plate exposed from the sealing member is inserted into the opening of the support frame and the heat dissipating member with multiple fins formed by folding the metal plate is bonded to both the metal base plate and the support frame. With such a configuration, the folded shape of each of the fins of the heat dissipating member can be maintained and heat dissipation can be secured. In addition, by the method of manufacturing the semiconductor apparatus according to the present invention, the semiconductor apparatus can be obtained by the simple processes.

MODES FOR CARRYING OUT INVENTION

Embodiment 1

Figure 1:
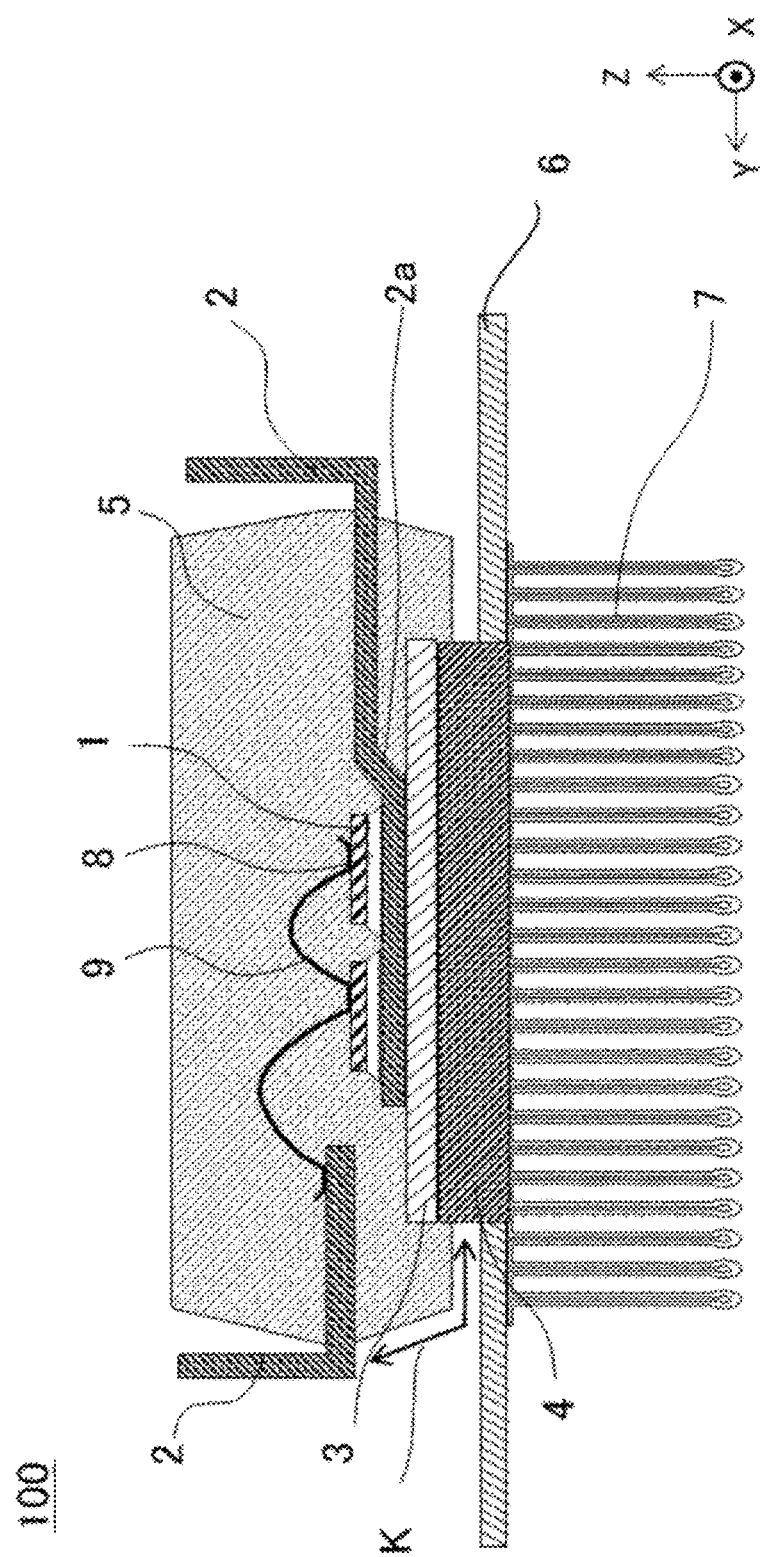
FIG. 1 is a cross-sectional diagram showing a schematic configuration of a semiconductor apparatus according to Embodiment 1 of the present disclosure.
Figure 2:
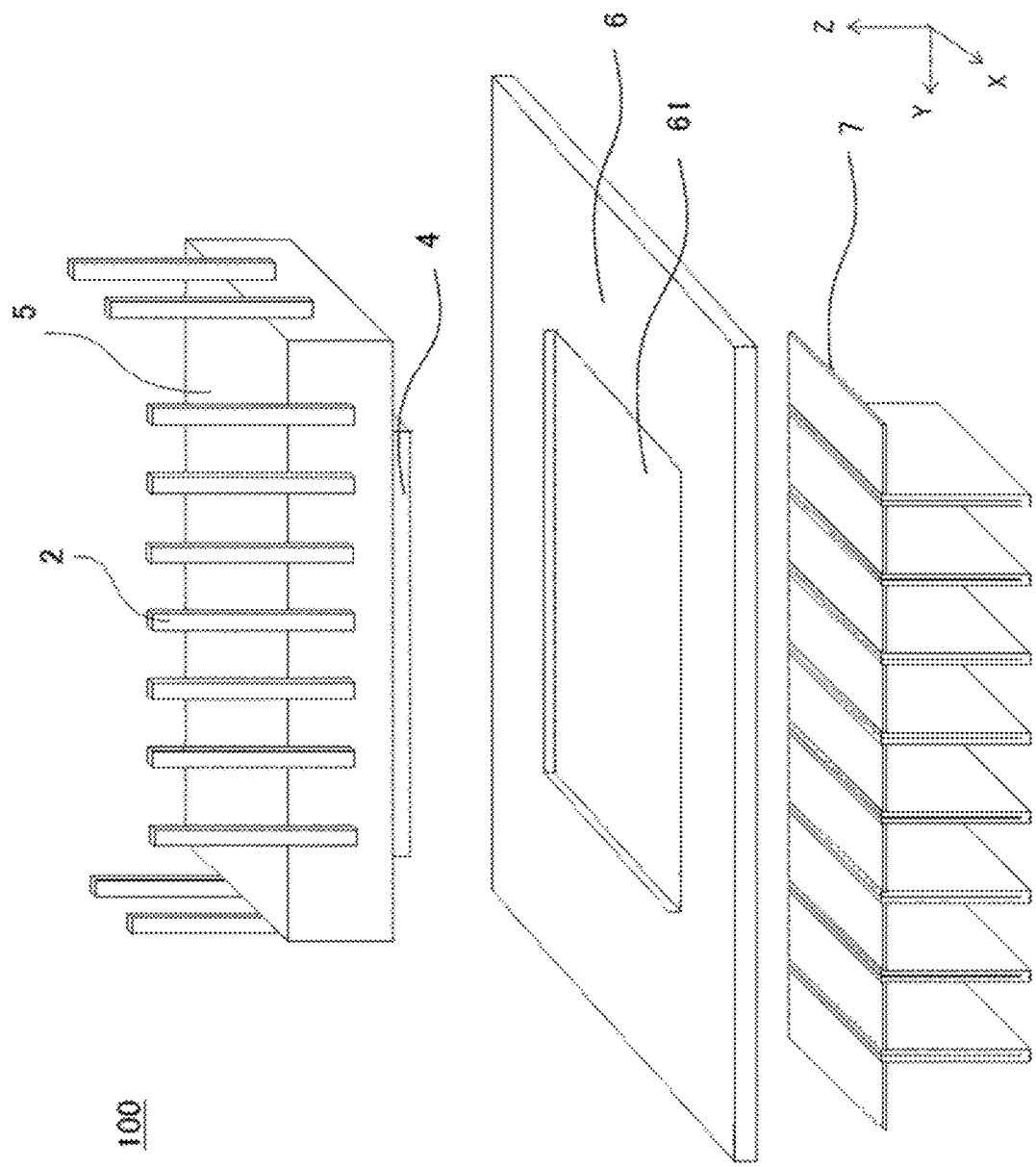
FIG. 2 is a perspective view showing an exploded schematic configuration of the semiconductor apparatus according to Embodiment 1 of the present disclosure.

FIG. 1 is a cross-sectional diagram showing a schematic configuration of a semiconductor apparatus according to Embodiment 1 of the present disclosure. FIG. 2 is a perspective diagram showing a schematic configuration in which the semiconductor apparatus according to Embodiment 1 of the present disclosure is separated into components, the components being arranged in the thickness direction of the apparatus. In this figure, the thickness direction of the semiconductor apparatus is indicated by Z axis, the width direction thereof is indicated by Y axis, and the depth direction of thereof is indicated by X axis. In the following description, the positive direction and the negative direction of the Z axis are referred to as the upward direction and the downward direction, respectively. Also, the terms "identical", "parallel", "vertical", and "orthogonal" conceptually include "substantially identical", "substantially parallel", "substantially vertical", and "substantially orthogonal", respectively, unless otherwise specified.

As shown in FIG. 1, a semiconductor apparatus 100 includes a semiconductor device 1, a lead frame 2, an insulating layer 3, a metal base plate 4, a sealing member 5, a support frame 6, and a heat dissipating member 7. The heat dissipating member 7 is bonded to both the metal base plate 4 and the support frame 6.

The semiconductor device 1 is bonded to the lead frame 2 via a bonding layer 8 such as solder.

The lead frame 2 is provided on the insulating layer 3 to form a wiring circuit. Wires 9 such as aluminum wires are used for electrical connection between the semiconductor devices 1, between portions of the lead frame 2, and between the semiconductor device 1 and the lead frame 2. The metal base plate 4 is provided on the face opposite to the face of the insulating layer 3 on which the semiconductor device 1 is bonded.

The metal base plate 4 is a metal substrate to diffuse heat transferred from the semiconductor device 1 via the insulating layer 3. For the metal base plate 4, a metal material having high thermal conductivity, such as aluminum or copper, is used.

The semiconductor device 1, the lead frame 2, the insulating layer 3, and the metal base plate 4 are sealed with the sealing member 5 in such a way that a portion of the lead frame 2 and a portion of the metal base plate 4 are exposed from the sealing member 5.

The support frame 6 has an opening 61 in the center that corresponds to the bottom face of the metal base plate 4 in size. An exposed portion of the metal base plate 4 from the sealing member 5 is inserted in the opening 61 of the support frame 6. Of the exposed portion of the metal base plate 4 from the sealing member 5, a portion inserted into the opening 61 is bonded to the heat dissipating member 7. In addition, the face opposite to the face of the support frame 6 on the side of the insulating layer 3 is bonded to the heat dissipating member 7. Note here that the face of the metal base plate 4 and the face of the support frame 6 that are each bonded to the heat dissipating member 7 should preferably be flush with each other to ensure bonding reliability.

The support frame 6 is made, for example, of a metal with high rigidity. Due to the high vibration resistance provided by the support frame 6 made of a metal with high rigidity, the bonding reliability among the metal base plate 4, the heat dissipating member 7, and the support frame 6 can be ensured. If a metal with low rigidity such as aluminum is to be used for the support frame 6, the rigidity can be ensured by increasing the thickness thereof. It is preferable that the support frame 6 should be made of metals of different kinds for enhancing its rigidity and be fixed to the metal base plate 4 by laser welding, caulking, or the like for high vibration resistance.

FIG. 1 shows an example in which the face opposite to the face of the metal base plate 4 on which the insulating layer 3 is provided is similar to the opening 61 of the support frame 6 in size, and fitted thereinto. Instead, however, a space or a bonding material such as solder may be provided between the support frame 6 and the metal base plate 4. Further, FIG. 1 shows an example in which the support frame 6 is a single plate with the opening 61 being an aperture provided in the center. Instead, however, the support frame 6 may be made of a plurality of plates arranged in such a way that the opening 61 is provided in the center.

Figure 3:
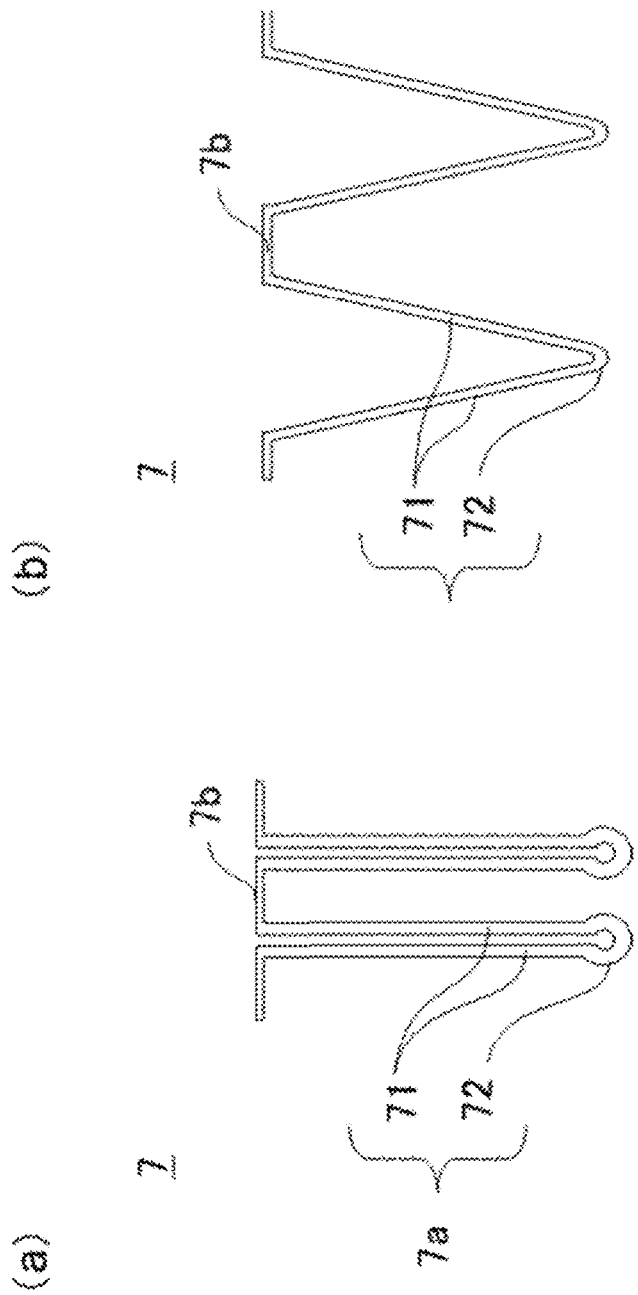
FIG. 3 is a schematic configuration diagram showing a portion of a heat dissipating member of the semiconductor apparatus according to Embodiment 1 of the present disclosure.

FIG. 3 is a schematic diagram showing an enlarged portion of the heat dissipating member of the semiconductor apparatus according to Embodiment 1 of the present disclosure. FIG. 3(a) shows the fins of the heat dissipating member with their faces overlapped with each other, and FIG. 3(b) shows the fins of the heat dissipating member with spacing between their faces being widened. As shown in FIG. 3, the heat dissipating member 7 is formed, for example, by folding a single, thin metal plate multiple times so as to have multiple fins 7a. Each of the fins 7a are bent to have faces 71 facing each other and has an end 72 that is a folded back portion. When external force is applied to each of the fins 7a, it stretches and compresses like a spring, deforming from the state in which the faces 71 facing each other with their faces overlapped in FIG. 3(a) to the state in which the spacing between the faces 71 are widened as shown in FIG. 3(b). When the spacing between the faces 71 facing each other in the fins 7a are widened, the contact area between the heat dissipating member 7 and the metal base plate 4 and between the heat dissipating member 7 and the support frame 6 is reduced, and heat transfer is not efficient. Therefore, as shown in FIG. 3(a), the fins 7a are folded to be overlapped in such a way that the faces 71 facing each other to be along the direction perpendicular to the face on which the metal base plate 4 is bonded.

The heat dissipating member 7 has flat portions 7b each between the fins 7a adjacent to each other as well as at both ends in the array direction of the fins 7a, the flat portions 7b each being parallel to the metal base plate 4 and the support frame 6. The heat dissipating member 7 is bonded at each flat portion 7b to either the metal base plate 4 or the support frame 6 by laser welding or the like.

The heat dissipating member 7 having multiple fins 7a formed by folding the metal plate in this way is characterized by its lightweight and low heat capacity compared with a heat dissipating member made by integrally molding a base plate and fins by casting and with a heat dissipating member made by joining multiple fins to a base plate by caulking, etc. Therefore, thermal bonding such as welding can be easily performed for bonding the heat dissipating member 7 to the metal base plate 4 and the support frame 6. Here, the heat dissipating member 7 should preferably be a metal of the same kind as the metal base plate 4 and the support frame 6. This allows bonding without excessive melting of either of the metals when bonding by welding.

Figure 4:
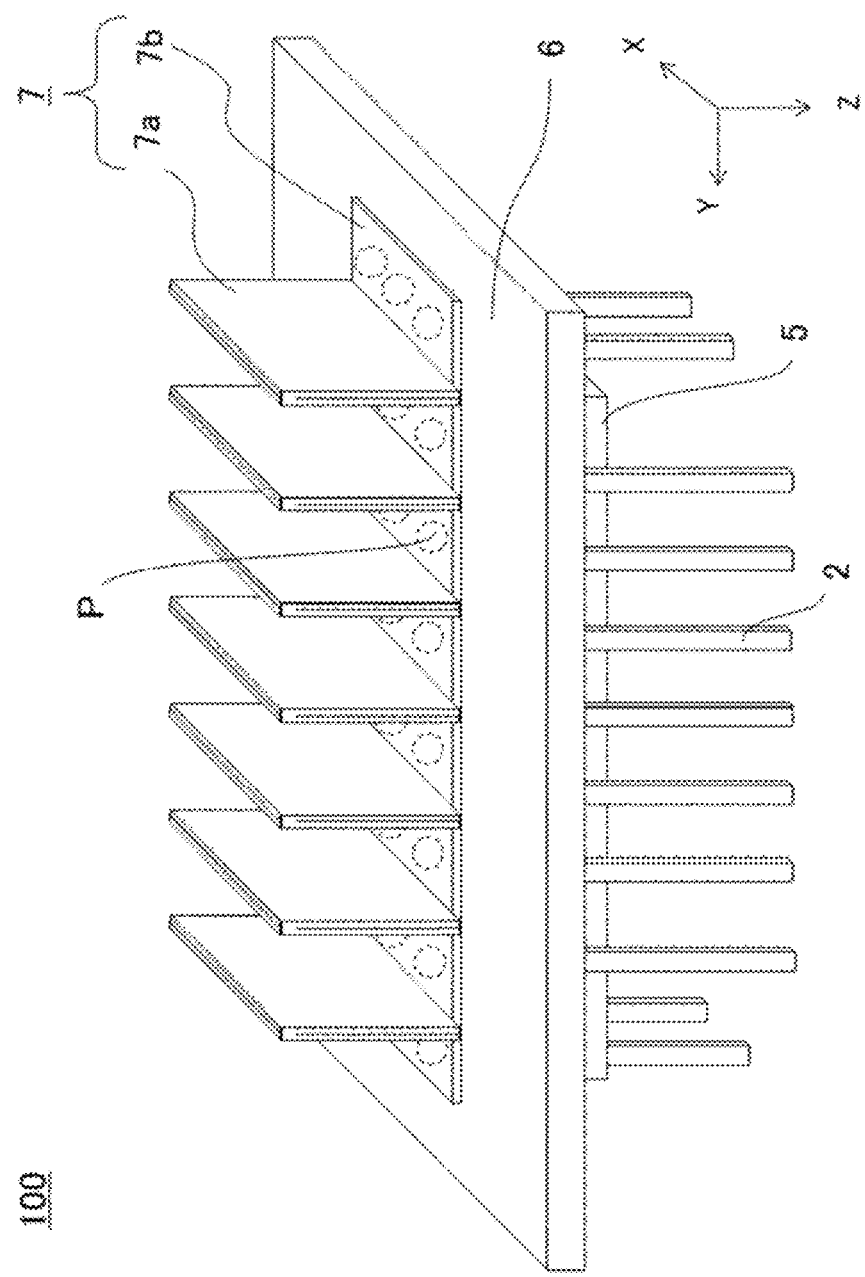
FIG. 4 is a perspective view showing a schematic configuration of the semiconductor apparatus according to Embodiment 1 of the present disclosure.

FIG. 4 is a perspective view showing a schematic configuration of the semiconductor apparatus according to Embodiment 1 of the present disclosure. FIG. 4 is a diagram in which the semiconductor apparatus of FIG. 1 is turned upside down, so that the heat dissipating member is shown on the upper side. As shown in FIG. 4, the heat dissipating member 7 is bonded to the metal base plate 4 and the support frame 6 at a plurality of bonding points P. The heat dissipating member 7 should preferably be bonded to the metal base plate 4 and the support frame 6 by welding, for example. In welding, the metals are directly bonded to each other without a joining material such as grease, so it is possible to prevent the increase in thermal resistance due to the joining material.

The flat portions 7b of the heat dissipating member 7 should preferably be thinner than the metal base plate 4 and support frame 6 to which the heat dissipating member 7 is to be bonded. For example, when the heat dissipating member 7 is bonded to the metal base plate 4 by laser welding, the laser irradiation time may be extended or the laser output may be increased to widen the melting range of the heat dissipating member 7 and the metal base plate 4. However, in that case, the excessive heat transferred to the metal base plate 4 may deteriorate insulation of the insulating layer 3. By forming the heat dissipating member 7 thinner than the metal base plate 4 and the support frame 6, welding can be performed without applying excessive heat.

Heat dissipation of the heat dissipating member 7 is improved in accordance with the increase in the number of the fins 7a and in the overall size of the heat dissipating member 7. However, the metal base plate 4 needs to be integrally sealed with the semiconductor device 1 and other components when the sealing member 5 is formed, so that the size of the metal base plate 4 is naturally limited by the mold used for the molding. Therefore, in a plan view of the semiconductor apparatus 100 from the side where the semiconductor device 1 is bonded, the width of the heat dissipating member 7 is larger than the width of the metal base plate 4. In this case, if only the metal base plate 4 and the heat dissipating member 7 are bonded, in a part of the heat dissipating member 7 protruding from the area of the metal base plate 4, cooling air applied to the space between the faces 71 facing each other in the fins 7a causes the spacing between the faces 71 to be widened, and thus the reduction of bonding strength and the deterioration of heat-dissipation may be matters of concern. Here, the width is the length in either the width direction (Y-axis direction) or the depth direction (X-axis direction) of the semiconductor apparatus 100 in FIG. 1. Note that, the width of the heat dissipating member 7 should be larger than the width of the metal base plate 4 in the same direction in at least one of the array direction (Y-axis direction) of the fins 7a of the heat dissipating member 7 and the direction (X-axis direction) perpendicular to the array direction.

In the present embodiment, the exposed portion of the metal base plate 4 is inserted and fixed in the opening 61 of the support frame 6. The heat dissipating member 7 is bonded to both the exposed portion of the metal base plate 4 inserted into the opening 61 and the support frame 6, thereby keeping the heat dissipating member 7 to be folded and preventing decrease in the bonding strength and deterioration of the heat dissipation.

It is preferable that the support frame 6 should be provided without direct contact to the sealing member 5. The arrow K in FIG. 1 indicates the creepage distance for insulation from the lead frame 2 to the metal base plate 4. If the support frame 6 that is electrically conductive is in contact with the sealing member 5, the creepage distance for insulation from the lead frame 2 sticking out from the side of the sealing member 5 to the metal base plate 4 is from the lead frame 2 to the support frame 6 along the sealing member 5 because the support frame 6 is electrically conductive with the metal base plate 4. By providing the support frame 6 without direct contact with the sealing member 5, the creepage distance for insulation from the lead frame 2 sticking out from the side of the sealing member 5 to the metal base plate 4 can be increased, thereby ensuring the insulation.

Figure 5:
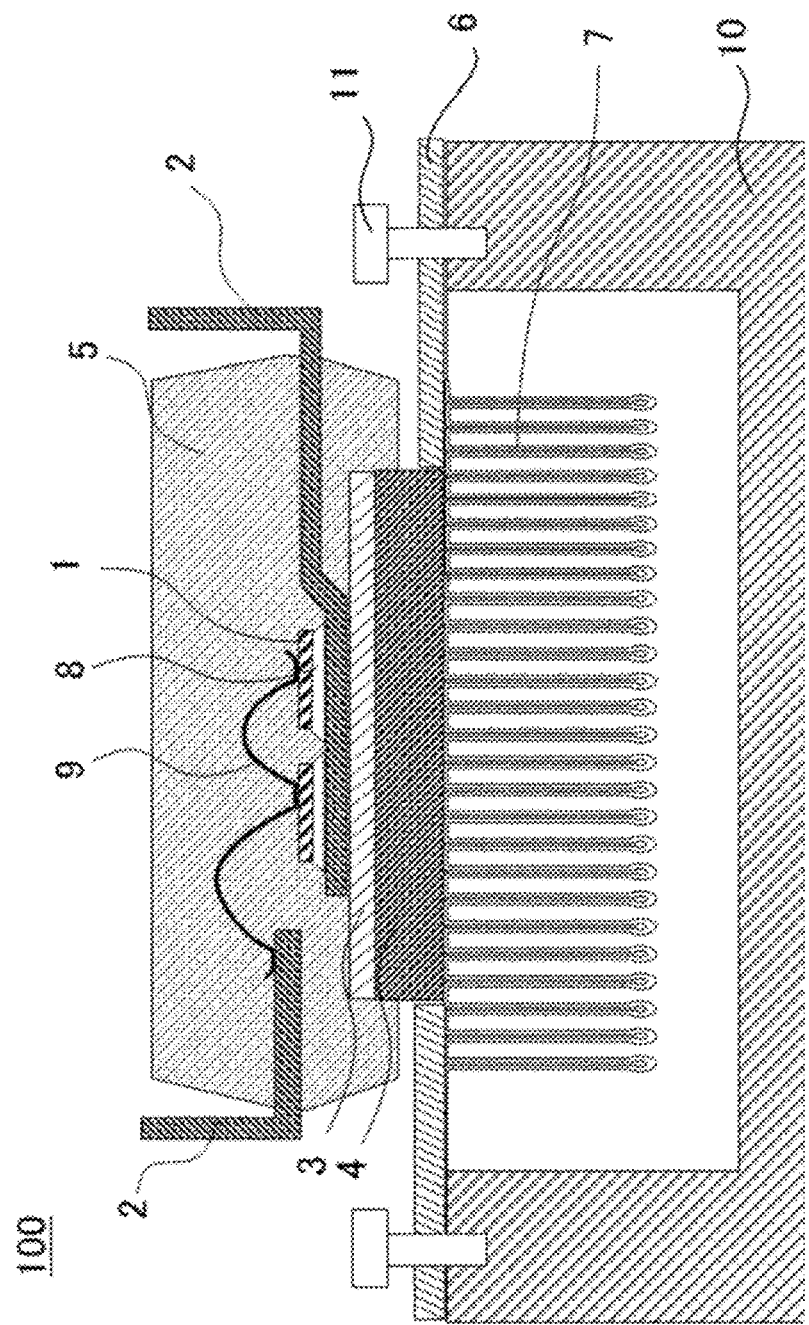
FIG. 5 is a schematic configuration diagram showing the semiconductor apparatus according to Embodiment 1 of the present disclosure attached to an external housing.

FIG. 5 is a schematic configuration diagram showing the semiconductor apparatus according to Embodiment 1 of the present disclosure attached to an external housing. As shown in FIG. 5, in the semiconductor apparatus 100, the support frame 6 is attached to the external housing 10 which is grounded. Screw holes are provided in the support frame 6, and the semiconductor apparatus 100 is fixed to the external housing 10 by fastening screws 11 into the screw holes of the support frame 6. The metal base plate 4, the support frame 6, the heat dissipating member 7, and the screws 11 are all formed of electrically conductive materials such as metal, so that the screw fastening of the support frame 6 to the external housing 10 electrically connects the support frame 6, the metal base plate 4, and the heat dissipating member 7 to each other, thereby providing stable ground potential.

Next, each part of the semiconductor apparatus 100 will be described in detail.

The semiconductor device 1 is a device such as a diode used in a converter unit for converting input AC power into DC power, a bipolar transistor used in an inverter unit for converting input DC power into AC power, an insulated gate bipolar transistor (IGBT), a metal oxide semiconductor field effect transistor (MOSFET), and a gate turn-off thyristor (GTO).

The lead frame 2 is a wiring circuit of a predetermined shape formed, for example, by punching a copper plate or a steel plate having a thickness of about 0.6 mm. As shown in FIG. 1, the lead frame 2 has a step portion 2a that is bent so as to be separated from the insulating layer 3, and the sealing member 5 is filled between the step portion 2a and the insulating layer 3. The step portion 2a of the lead frame 2 thus formed prevents dielectric breakdown possibly occurring along the interface between the insulating layer 3 and the sealing member 5. The step portion 2a of the lead frame 2 is formed by, for example, bending or half blanking. The elevation of the step portion 2a of the lead frame 2 is, for example, between 0.1 mm and the half the thickness of the lead frame 2, which is 0.3 mm. The elevation of 0.1 mm or more prevents a void from forming in the sealing member 5 that is filled between the insulating layer 3 and the lead frame 2. The elevation of 0.3 mm or less, which is the half or less the thickness of the lead frame 2, secures the strength of the frame.

The insulating layer 3 formed of an insulating material with high heat dissipation insulates the lead frame 2 from the metal base plate 4. The heat generated in the semiconductor device 1 is dissipated to the metal base plate 4 via the insulating layer 3. The insulating layer 3 is formed of a thermosetting resin such as epoxy resin in which a filler of high thermal conductivity such as silica, alumina, and boron nitride is mixed.

The sealing member 5 is formed of, for example, a thermosetting resin such as epoxy resin at high temperature by transfer molding using a mold. Alternatively, injection molding, compression molding and the like may be employed.

Figure 6:
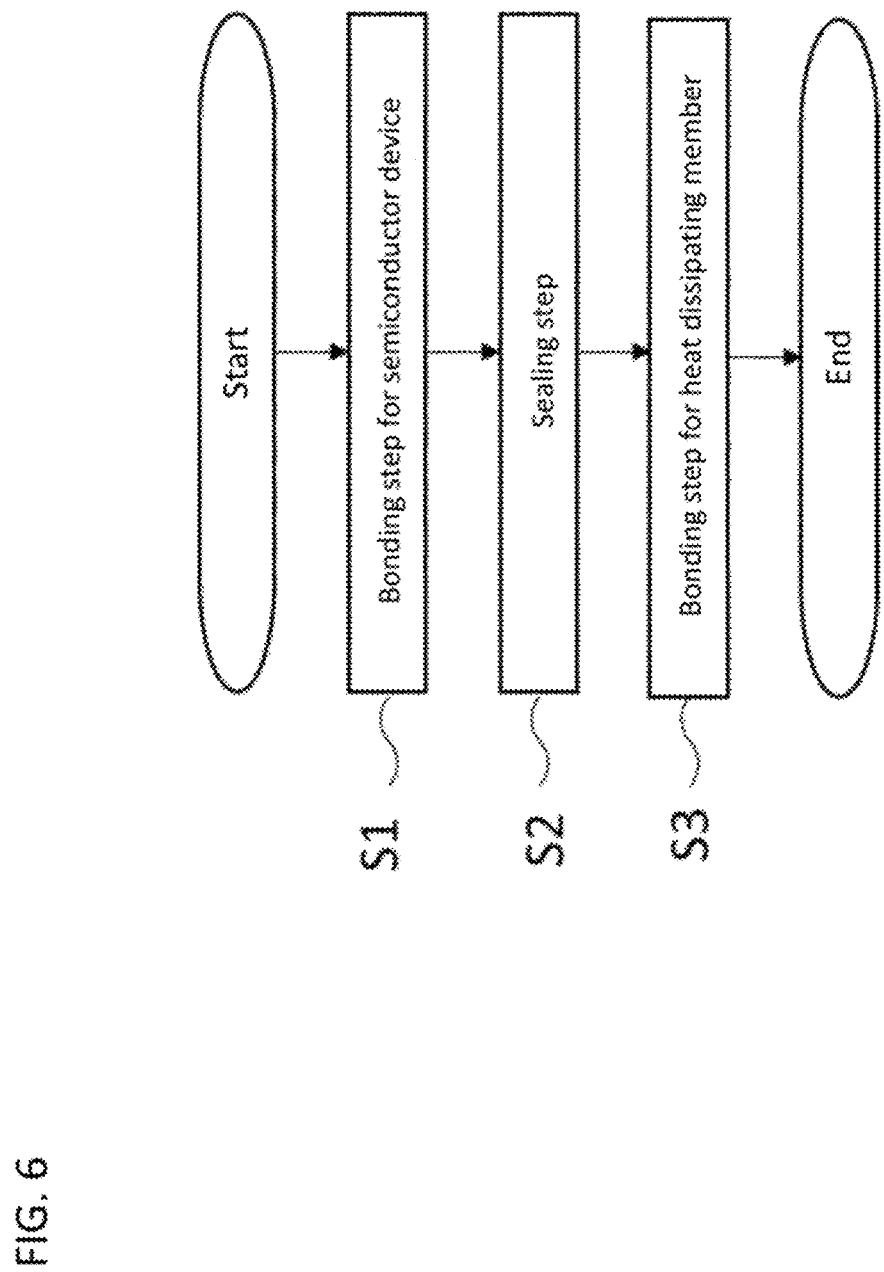
FIG. 6 is a flowchart showing a manufacturing process of the semiconductor apparatus according to Embodiment 1 of the present disclosure.

Next, the manufacturing method for the semiconductor apparatus 100 according to Embodiment 1 of the present disclosure will be described. FIG. 6 is a flowchart showing a manufacturing process of the semiconductor apparatus according to Embodiment 1 of the present disclosure.

In the bonding step for the semiconductor device 1, the bonding layer 8 such as solder is applied to a predetermined position on the lead frame 2, and the semiconductor device 1 is bonded on the bonding layer 8 in a reflow process or the like. That is, the applied solder melts at high temperature and the semiconductor device 1 and the lead frame 2 are electrically connected. Next, the semiconductor device 1 and the lead frame 2 are electrically connected by the wires 9. Here, the wires 9 are used for the electrical connection but the means for the connection is not limited thereto as long as they are electrically connectable.

Next, in the sealing step, the semiconductor device 1, the lead frame 2, the insulating layer 3, and the metal base plate 4 are sealed with resin by, for example, the transfer molding. The metal base plate 4 is placed in the mold and the insulating layer 3 in a semi-cured state is stacked on the metal base plate 4. Then, the lead frame 2 on which the semiconductor device 1 is bonded is placed on the insulating layer 3. Next, material of the sealing member 5 is injected into the mold by the transfer molding machine. In this step, the components placed on the metal base plate 4 are sealed by the sealing member 5. Specifically, the sealing member 5 seals the semiconductor device 1, a part of the lead frame 2, the insulating layer 3, and a part of the metal base plate 4.

In the sealing step, owing to the resin-filling pressure and the resin temperature in the mold, not only the resin is cured to form the sealing member 5, but also the insulating layer 3 which is in a semi-cured state is brought into a cured state while being pressed against the metal base plate 4 via the lead frame 2. This improves the insulation and the heat dissipation of the insulating layer 3.

In the sealing step, it is preferable to match the curing time of the resin used for the sealing member 5 with the curing time of the insulating layer 3 from its semi-cured state. If the curing time of the resin used for the sealing member 5 is longer than the curing time of the insulating layer 3 from its semi-cured state, the insulating layer 3 that is cured earlier may result in the deterioration of the bonding between the lead frame 2 and the insulating layer 3, thereby reducing the heat dissipation and insulation of the semiconductor apparatus 100.

When the sealing member 5 is cured after the sealing step, the semiconductor apparatus 100 is taken out of the mold and required plating is applied to each component. For example, the surface of the lead frame 2, sticking out from the side of the sealing member 5, is plated to form a terminal. This process may be omitted if it is plated in advance.

Next, the bonding step for the heat dissipating member 7 is performed. The exposed portion of the metal base plate 4 exposed from the sealing member 5 is inserted into the opening 61 of the support frame 6 to be fixed therein. Next, the heat dissipating member 7 is bonded to both the part of the exposed portion of the metal base plate 4 that is inserted into the opening 61 and the support frame 6. Here, the bonding method is, for example, welding, and the bonding is done by irradiating laser light through local melting. Direct welding of metals is performed between the heat dissipating member 7 and the metal base plate 4, also between the heat dissipating member 7 and the support frame 6 without applying a joining material such as grease, an adhesive, and solder; this prevents increase of the thermal resistance caused by such a joining material.

Because any separation or gap between the heat dissipating member 7 and the metal base plate 4 reduces heat dissipation, each of the flat portions 7b of the heat dissipating member 7 should have at least one bonding point P so as to be free from such a separation or gap and bonded to the metal base plate 4. Further, the support frame 6 and the metal base plate 4 should preferably be fixed to each other by welding, caulking or the like, thereby improving vibration resistance.

With these steps followed, the semiconductor apparatus 100 shown in FIG. 1 can be obtained. Some of these steps may be swapped in order or omitted. Then, the semiconductor apparatus 100 is attached to the external housing 10. Specifically, the semiconductor apparatus 100 is fixed to the external housing 10 by fastening the screws 11 into the screw holes provided in the support frame 6.

As described so far, the semiconductor apparatus 100 according to the present embodiment includes the semiconductor device 1, the lead frame 2, the insulating layer 3, and the metal base plate 4 that are sealed by the sealing member 5, the support frame 6 with the opening 61 into which the exposed portion of the metal base plate 4 exposed from the sealing member 5 is inserted, and the heat dissipating member 7 which has the multiple fins 7a formed by folding the metal plate and is bonded both to the exposed portion of the metal base plate 4 inserted into the opening 61 and to the support frame 6. Even when the heat dissipating member 7 is wider than the metal base plate 4, widening of each fin 7a is avoided to maintain its folded shape, thereby ensuring the required heat dissipation. In addition, the manufacturing method for the semiconductor apparatus 100 according to the present embodiment makes it possible to obtain the semiconductor apparatus 100 by the simple steps.

Embodiment 2

Figure 7:
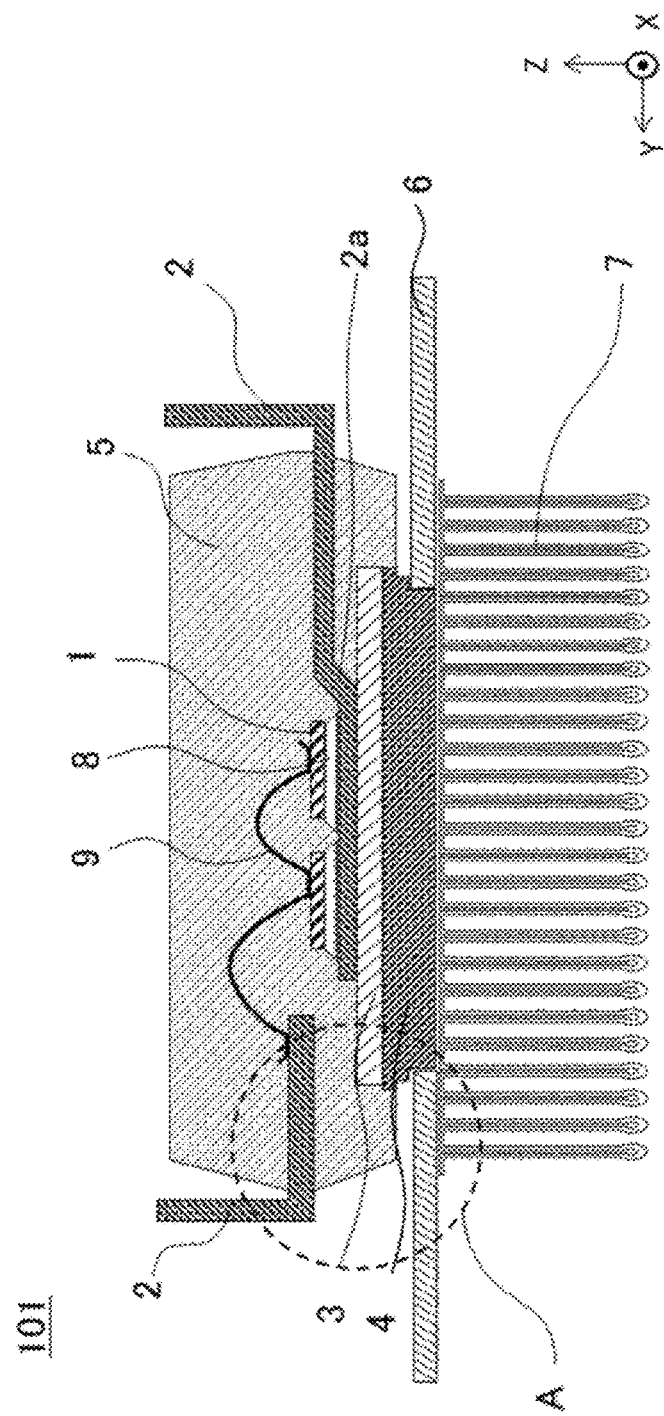
FIG. 7 is a cross-sectional diagram showing a schematic configuration of a semiconductor apparatus according to Embodiment 2 of the present disclosure.

In the following, the explanation given in Embodiment 1 will not be repeated to focus on the different points. FIG. 7 is a schematic configuration diagram of a semiconductor apparatus according to Embodiment 2 of the present disclosure. A semiconductor apparatus 101 includes the semiconductor device 1, the lead frame 2, the insulating layer 3, a metal base plate 4, the sealing member 5, the support frame 6, and the heat dissipating member 7. The heat dissipating member 7 has the multiple fins 7a formed by folding a metal plate and is bonded to both the metal base plate 4 and the support frame 6.

Figure 8:
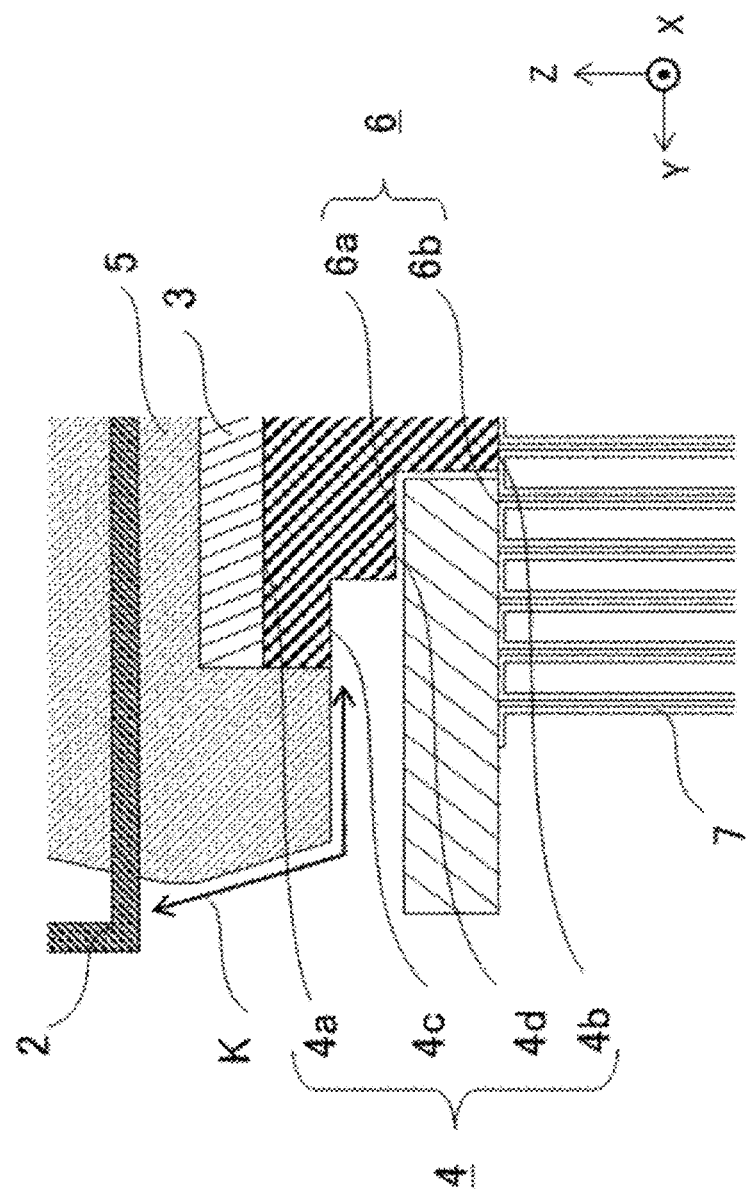
FIG. 8 is a schematic diagram showing an enlarged portion of the semiconductor apparatus according to Embodiment 2 of the present disclosure.
Figure 9:
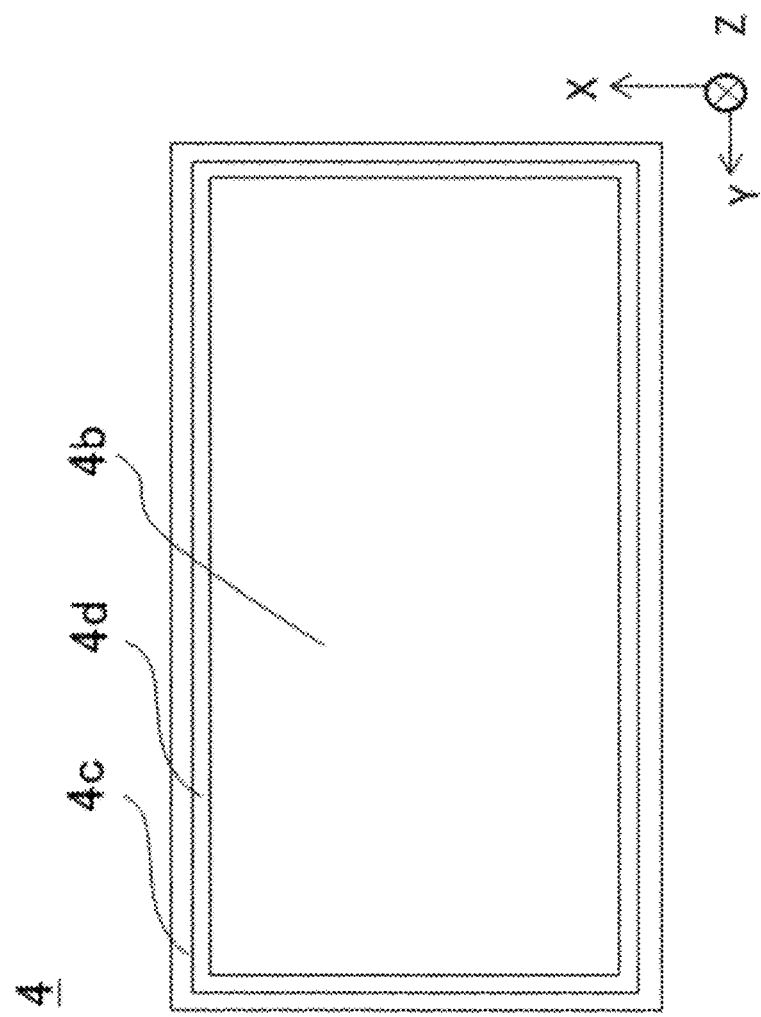
FIG. 9 is a plan view showing a schematic configuration of a metal base plate of the semiconductor apparatus according to Embodiment 2 of the present disclosure.

FIG. 8 is a schematic diagram showing an enlarged portion of the semiconductor apparatus according to Embodiment 2 of the present disclosure, the portion having been encircled by the dotted line A in FIG. 7. FIG. 9 is a plan view showing a schematic configuration of the metal base plate of the semiconductor apparatus according to Embodiment 2 of the present disclosure. In FIG. 9, the metal base plate is viewed from a position on the side where the heat dissipating member is attached. As shown in FIGS. 8 and 9, the outer periphery of the metal base plate 4 is formed with steps in such a way that along the sides from the face 4a provided with the insulating layer 3 to the face 4b to be bonded to the heat dissipating member 7, the face 4a provided with the insulating layer 3 is larger than the face 4b to be bonded with the heat dissipating member 7. The metal base plate 4 includes two step faces between the face 4a provided with the insulating layer 3 and the face 4b to be bonded to the heat dissipating member 7, each of the step faces being parallel to the faces 4a and 4b. In the thicknesswise direction, the step face closer to the face 4a provided with the insulating layer 3 is called the first step face 4c; the step face distant therefrom is called the second step face 4d.

Figure 10:
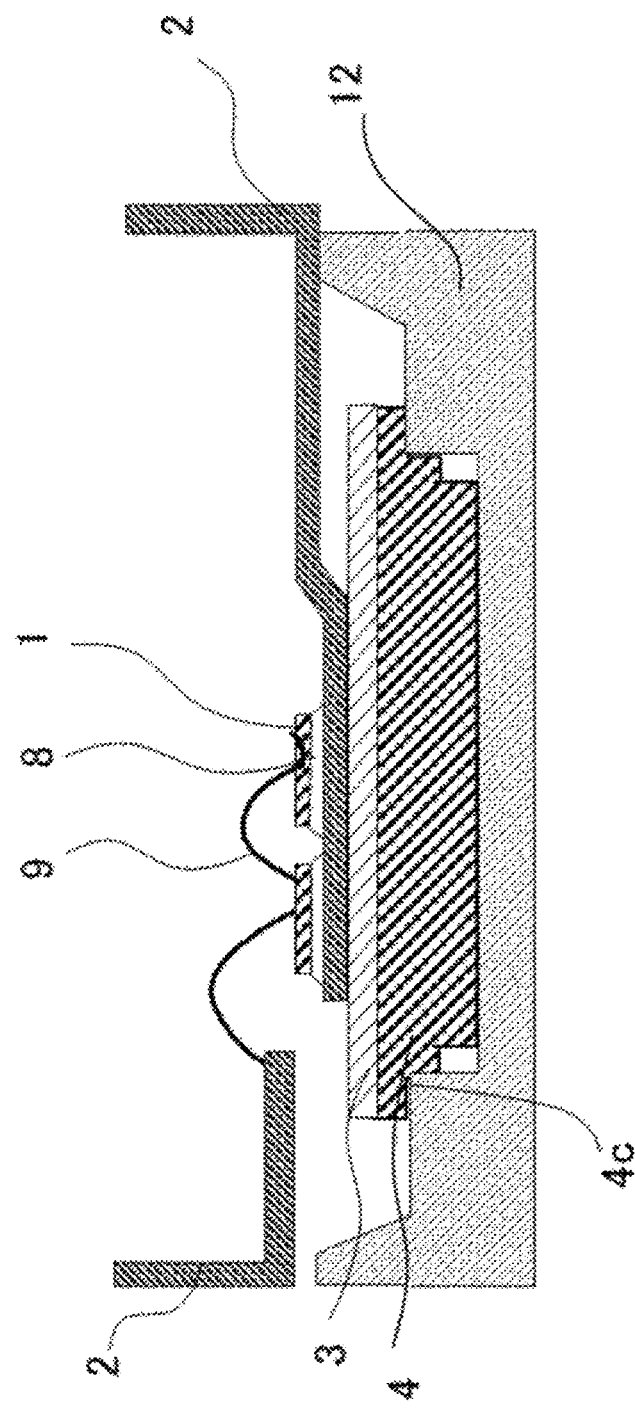
FIG. 10 is a schematic diagram showing a manufacturing process for the semiconductor apparatus according to Embodiment 2 of the present disclosure.

FIG. 10 is a schematic diagram showing a manufacturing process for the semiconductor apparatus according to Embodiment 2 of the present disclosure. As shown in FIG. 10, the first step face 4c is a face formed in a portion of the metal base plate with which the mold 12 is to be in contact when the sealing member 5 is being formed by the transfer mold method or the like. As described above, because the first step face 4c is provided to be in contact with the mold 12, the material of the sealing member 5 is prevented from flowing onto the face 4b of the metal base plate 4 to be in contact with the heat dissipating member 7. FIG. 10 shows only the lower mold, omitting the upper mold. Alternatively, however, the upper mold may be provided so as to be in contact with the first step face 4c.

The second step face 4d is located laterally outside the opening 61 of the support frame 6, not in contact with the sealing member 5, but in contact with a face 6a opposite to a face 6b of the support frame 6, the face 6b being bonded to the heat dissipating member 7, thereby functioning to fix the metal base plate 4. The metal base plate 4 with the first step face 4c and the second step face 4d formed thereto as described above prevents the sealing member 5 from physically contacting with the support frame 6. Here, a configuration with two step faces are exemplified, but there may be more than two step faces.

The arrow K in FIG. 8 indicates the creepage distance for insulation from the lead frame 2 to the metal base plate 4. If the support frame 6 that is electrically conductive is in contact with the sealing member 5, the creepage distance for insulation from the lead frame 2 sticking out from the side of the sealing member 5, to the metal base plate 4 is shortened because the support frame 6 is electrically conductive with the metal base plate 4, which may deteriorate the insulation and eventually lead to increase in the package size of the apparatus. In the present embodiment, the physical separation between the support frame 6 and the sealing member 5 provided by the first step face 4c and the second step face 4d formed in the metal base plate 4 increases the creepage distance for insulation from the lead frame 2 sticking out from the side of the sealing member 5 to the metal base plate 4, thereby ensuring insulation.

The height from the second step face 4d of the metal base plate 4 to the face 4b thereof in contact with the heat dissipating member 7 is designed to be substantially the same as the thickness of the support frame 6. That is, the face 4b of the metal base plate 4 in contact with the heat dissipating member 7 and the face 6b of the support frame 6 to which the heat dissipating member 7 is bonded are made flush with each other to ensure bonding reliability with the heat dissipating member 7.

Here, the first step face 4c needs to be provided on the entire periphery of the metal base plate 4 to prevent the material of the sealing member 5 from flowing in, but the second step face 4d only need to be provided to the extent that the metal base plate 4 is supported by the support frame 6, and may be formed only on the four corners of the metal base plate 4.

As described above, even when the heat dissipating member 7 in which fins 7a are formed by the folding and that has a larger width than the metal base plate 4, the folded shape of each of the fins 7a can be maintained and heat dissipation can be secured by inserting the metal base plate 4 into the support frame 6 with the opening 61 formed and bonding the heat dissipating member 7 to both the metal base plate 4 and the support frame 6. Further, in the present embodiment, the metal base plate 4 is provided with the two step faces 4c and 4d. This configuration enables the support frame 6 to be provided so as not to come into direct contact with the sealing member 5, while preventing the material of the sealing member 5 from wrapping around to the side 4b of the metal base plate 4 that is to be bonded to the heat dissipating member 7 during molding, thereby ensuring insulation.

Embodiment 3

In the following, the explanation given in Embodiment 1 or 2 will not be repeated to focus on the different points. A semiconductor apparatus 102 includes the semiconductor device 1, the lead frame 2, the insulating layer 3, a metal base plate 4, the sealing member 5, a support frame 6, and the heat dissipating member 7. The heat dissipating member 7 has the multiple fins 7a formed by folding a metal plate and is bonded to both the metal base plate 4 and the support frame 6.

Figure 11:
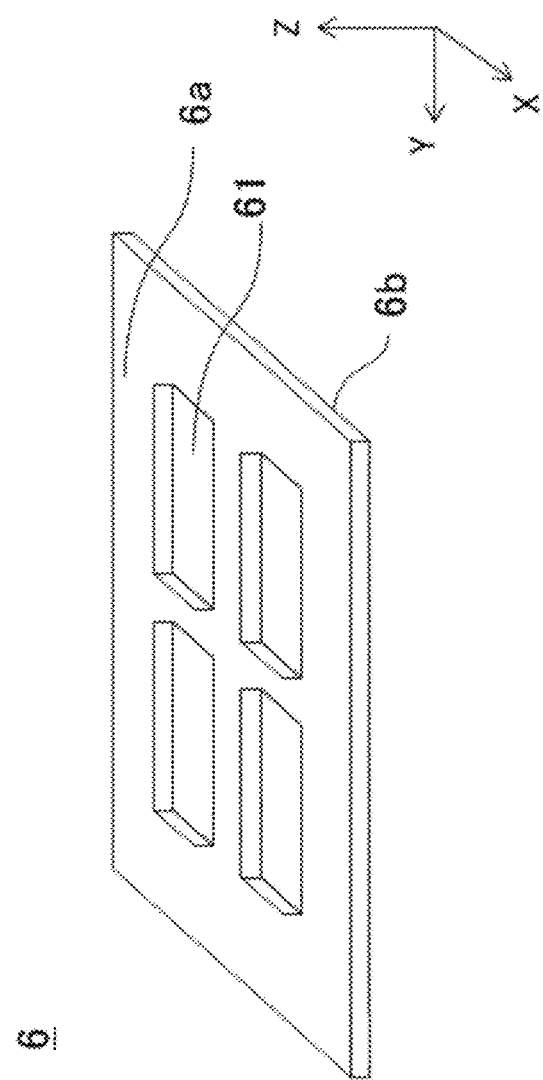
FIG. 11 is a perspective diagram showing a schematic configuration of a support frame of a semiconductor apparatus according to Embodiment 3 of the present disclosure.
Figure 12:
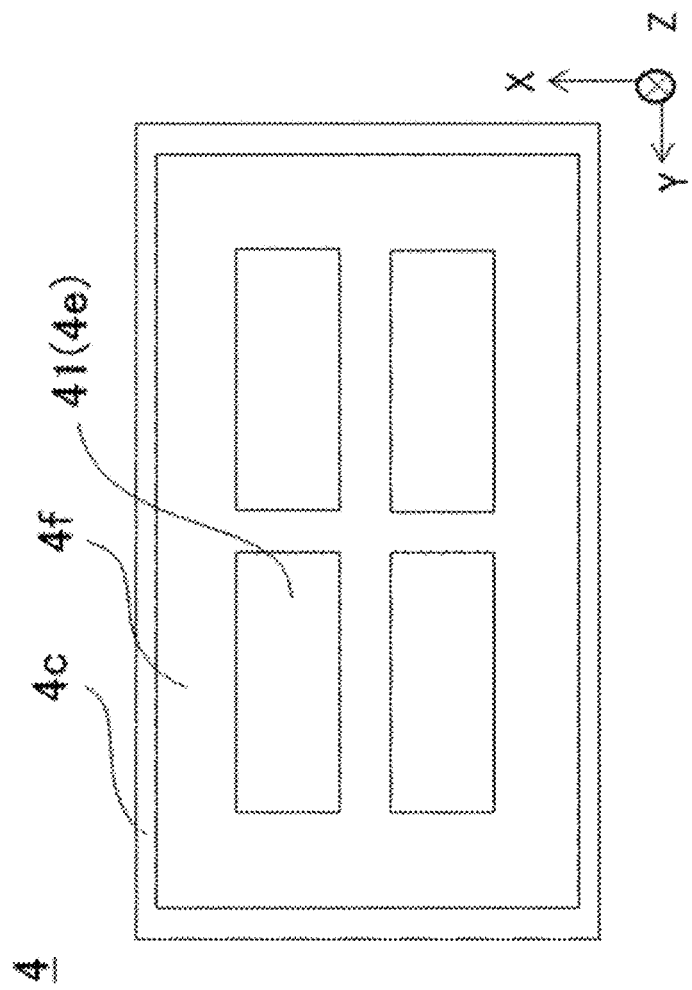
FIG. 12 is a plan view showing a schematic configuration of a metal base plate of the semiconductor apparatus according to Embodiment 3 of the present disclosure.

FIG. 11 is a schematic configuration diagram of the support frame of the semiconductor apparatus according to Embodiment 3 of the present disclosure. As shown in FIG. 11, the support frame 6 is provided with, for example, four openings 61. FIG. 12 is a plan view showing a schematic configuration of the metal base plate 4 of the semiconductor apparatus according to Embodiment 3 of the present disclosure. FIG. 12 is a plan view of the metal base plate 4 from the side where the heat dissipating member 7 is attached. As shown in FIG. 12, the face opposite to the face 4a on which the insulating layer 3 is to be provided in the metal base plate 4 has a plurality of projections 41 projecting toward the heat dissipating member 7 side. The plurality of the projections 41 are inserted into the openings 61 of the support frame 6 to be bonded to the heat dissipating member 7. The projections 41 is formed so that their height match the thickness of the support frame 6, and the faces 4e of the projections 41 to be bonded to the heat dissipating member 7 and the face 6b of the support frame 6 to be bonded to the heat dissipating member 7 are made flush with each other. The heat dissipating member 7 is bonded to both the metal base plate 4 and the support frame 6 by laser welding or the like.

Of the faces opposite to the face 4a on which the insulating layer 3 is provided in the metal plate 4, the face 4f located around the projections 41 is provided so as to be in contact with the face 6a, which is opposite to the face 6b that is to be bonded to the heat dissipating member 7 in the support frame 6. The support frame 6 with a plurality of the openings 61, configured as described above, has a larger contact area with the metal base plate 4, thereby improving vibration resistance.

It is preferable that the metal base plate 4 has at least one step face 4c formed on the periphery so that the face thereof on the insulating layer 3 side is wider than the face on the heat dissipating member 7 side thereof in the width direction. The step face 4c is provided so as to be in contact with the mold 12 when molding with the material of the sealing member 5 is performed. As a result, the sealing member 5 is formed so as not to come into direct contact with the support frame 6.

In the above example, the support frame 6 has four of the openings 61 and, correspondingly, the metal base plate 4 is provided with four of the faces 4e in contact with the heat dissipating member 7. However, the number of the openings 61 is not limited to four, but may be two, three, or more than four.

As described above, even when the heat dissipating member 7 in which the multiple fins 7a are formed by folding the metal plate and that has a larger width than the metal base plate 4, the folded shape can be maintained and heat dissipation can be secured by inserting the metal base plate 4 into the support frame 6 with the opening 61 formed and bonding the heat dissipating member 7 to both the metal base plate 4 and the support frame 6. Furthermore, in the present embodiment, the support frame 6 is provided with a plurality of the openings 61, and the metal base plate 4 has the projections 41 which are each inserted into the respective four openings 61 of the support frame 6 in the exposed portion from the sealing member 5. This configuration increases the contact area between the metal base plate 4 and the support frame 6, thereby improving vibration resistance.

Embodiment 4

Figure 13:
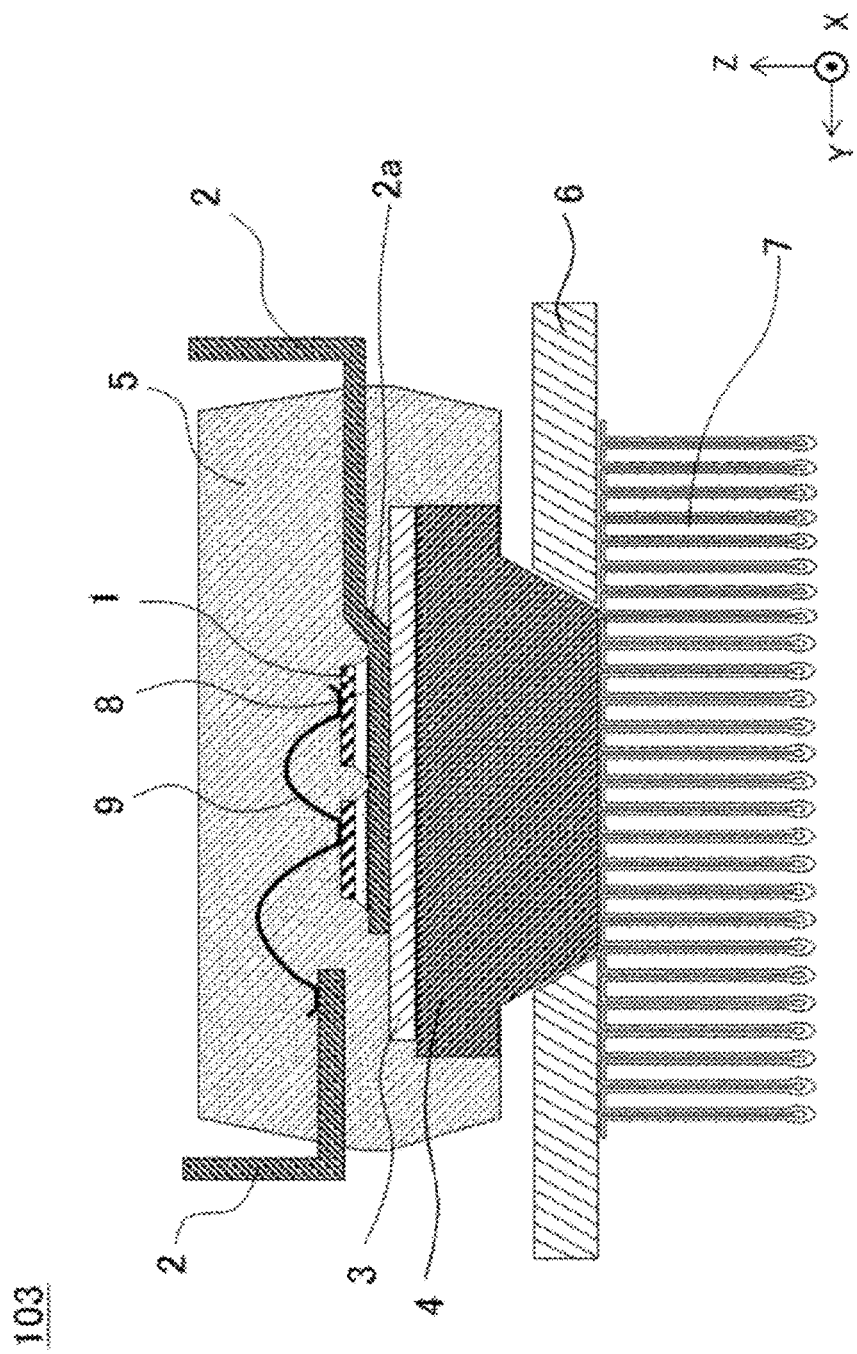
FIG. 13 is a cross-sectional diagram showing a schematic configuration of a semiconductor apparatus according to Embodiment 4 of the present disclosure.

FIG. 13 is a cross-sectional diagram showing a schematic configuration of a semiconductor apparatus according to Embodiment 4 of the present disclosure. In the following, the explanation given in Embodiments 1 to 3 will not be repeated to focus on the different points. In Embodiment 2, an example in which the second step face 4d is provided in the metal base plate 4 is shown, while, in the present embodiment, the metal base plate 4 and the opening 61 of the support frame 6 are tapered to fix the metal base plate 4 and the support frame 6.

A semiconductor apparatus 103 includes the semiconductor device 1, the lead frame 2, the insulating layer 3, a metal base plate 4, the sealing member 5, a support frame 6, and the heat dissipating member 7. The heat dissipating member 7 has the multiple fins 7a formed by folding a metal plate and is bonded to both the metal base plate 4 and the support frame 6.

As shown in FIG. 13, the opening 61 of the support frame 6 has a tapered shape that is inclined such that the opening width on the insulating layer 3 side is wider. The metal base plate 4 has a tapered shape such that the face 4a on which the insulation layer 3 is provided is wider than the face 4b that is to be bonded to the heat dissipating member 7. When the metal base plate 4 is inserted into the opening 61 of the support frame 6, the support frame 6 is fixed to the metal base plate 4 in the middle of the taper while being physically separated from the sealing member 5.

As described above, even when the heat dissipating member 7 in which the multiple fins 7a are formed by folding the metal plate and that has a larger width than the metal base plate 4, the folded shape of each of the fins 7a can be maintained and heat dissipation can be secured by inserting the metal base plate 4 into the support frame 6 with the opening 61 formed and bonding the heat dissipating member 7 to both the metal base plate 4 and the support frame 6. Furthermore, in the present embodiment, by making the outer face of the metal base plate 4 and the inner face of the opening 61 of the support frame 6 tapered, the support frame 6 and the sealing member 5 can be fixed apart, and the creepage distance for insulation from the lead frame 2 to the metal base plate 4 can be secured.

Note that, in Embodiments 1 to 4, examples are shown in which the heat dissipating member 7 is formed from a single metal plate, but multiple plates, for example, two or more plates, may be used. The use of multiple metal plates contributes to improvement of rigidity of the apparatus.

Embodiment 5

The present embodiment shows an application of the semiconductor apparatus described in Embodiments 1 to 4 to a power converter. Application of the present disclosure is not limited to a specific type of power converter. However, in the following description, an example in which the present disclosure is applied to a three-phase inverter will be described as Embodiment 5.

Figure 14:
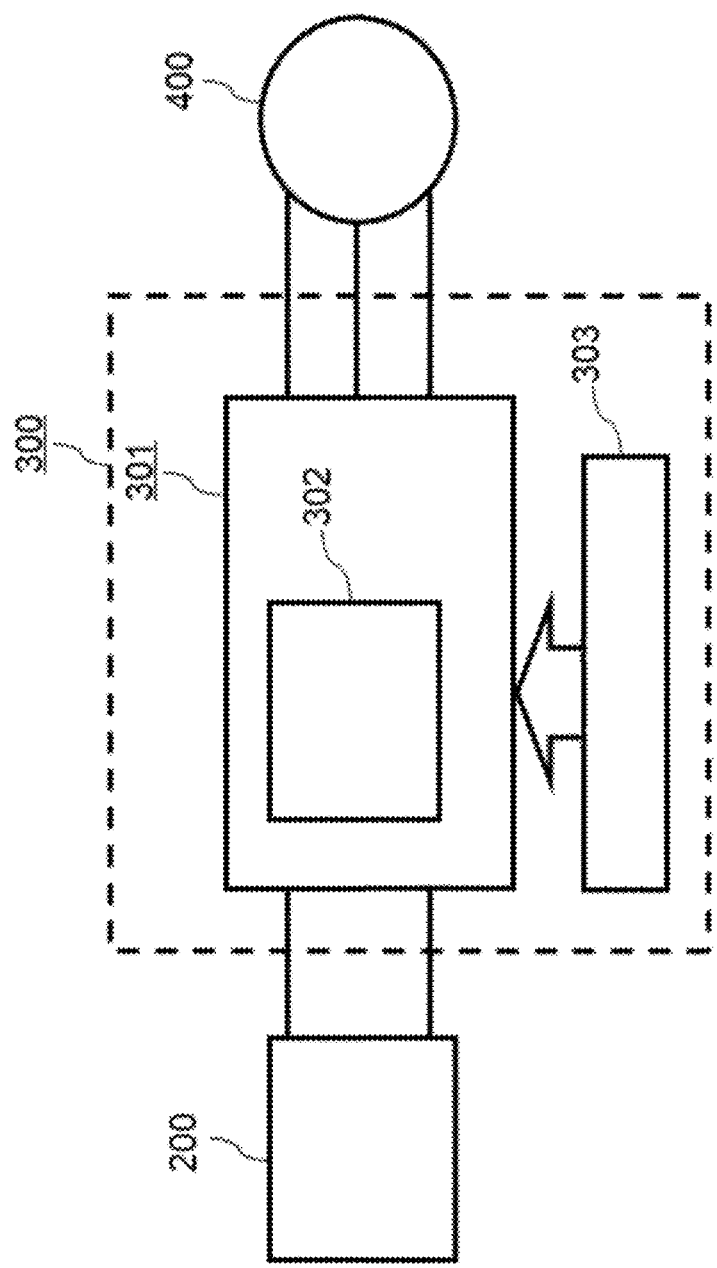
FIG. 14 is a schematic configuration diagram of a power conversion system according to Embodiment 5 to which the power converter according to the present disclosure is applied.

FIG. 14 is a block diagram showing a configuration of a power conversion system to which the power converter according to the present embodiment is applied.

The power conversion system in FIG. 14 includes a power supply 200, a power converter 300, and a load 400. The power supply 200 is a DC power supply that supplies DC power to the power converter 300. The power supply 200 can be configured with a variety of systems; for example, it can be configured with a DC system, a solar cell, a storage battery, or it can be configured with a rectifier circuit or AC/DC converter connected to an AC system. Further, the power supply 200 may be a DC/DC converter that converts the DC power outputted from a DC system to predetermined DC power.

The power converter 300 which is a three-phase inverter connected between the power supply 200 and the load 400 converts the DC power supplied from the power supply 200 into AC power and supplies the AC power to the load 400. As shown in FIG. 14, the power converter 300 includes a main conversion circuit 301 that converts DC power to AC power and a control circuit 303 that outputs a control signal to the main conversion circuit 301.

The load 400 is a three-phase electric motor driven by the AC power supplied by the power converter 300. The load 400 is an electric motor that is not limited in application to a specific purpose but is provided in a wide variety of electric apparatuses and systems such as a hybrid vehicle, an electric vehicle, a railway vehicle, an elevator, and an air conditioner.

The details of the power converter 300 will be described below. The main conversion circuit 301 includes a switching device and a reflux diode (both not shown). The main conversion circuit 301 converts the DC power supplied from the power supply 200 into AC power by switching of the switching device and supplies the AC power to the load 400. There is a variety of specific circuit configurations for the main conversion circuit 301. The main conversion circuit 301 in the present embodiment is a two-level three-phase full-bridge circuit, which is composed of six switching devices and six reflux diodes each anti-paralleled with its corresponding switching device. At least one of the switching devices and the reflux diodes of the main conversion circuit 301 includes the semiconductor apparatus 302 described in one of Embodiments 1 to 4. Every two of the six switching devices are connected in series to form upper and lower arms, and each upper and lower arm constitutes each phase (U-phase, V-phase, and W-phase) of the full bridge circuit. The output terminals from each upper and lower arm, that is, the three output terminals of the main conversion circuit 301, are connected to the load 400.

The main conversion circuit 301 includes a drive circuit (not shown) that drives the switching devices. Instead, however, the drive circuit may be provided within the semiconductor apparatus 302 or separately from the semiconductor apparatus 302. The drive circuit generates a drive signal that drives each switching device of the main conversion circuit 301 and provides the drive signal to the control electrode of each switching device of the main conversion circuit 301. Specifically, in accordance with the control signal received from a control circuit 303 (described later), the drive circuit outputs to the control electrode of each switching device a drive signal that turns the switching device to ON state or a drive signal that turns the switching device to OFF state. When each switching device is to be kept in ON state, a voltage signal (ON signal) higher than the threshold voltage of the switching device is provided thereto as the drive signal, whereas, when the switching device is to be kept in OFF state, a voltage signal (OFF signal) lower than the threshold voltage of the switching device is provided thereto as the drive signal.

The control circuit 303 controls the switching devices of the main conversion circuit 301 so that the desired electric power should be supplied to the load 400. Specifically, the time period (ON time period) in which each switching device of the main conversion circuit 301 should be in ON state is calculated on the basis of the electric power to be supplied to the load 400. The main conversion circuit 301 can be controlled, for example, by the PWM control in which the ON time period of the switching device can be modulated in accordance with the voltage to be outputted. The control circuit 303 outputs the control signals to the drive circuit included in the main conversion circuit 301 in such a way that, at each point of time, an ON signal is outputted to each switching device that needs to be in ON state and an OFF signal is outputted to each switching device that needs to be in OFF state. In accordance with these control signals, the drive circuit outputs an ON signal or an OFF signal as the drive signal to the control electrode of each of the switching devices.

In the power converter of the present embodiment, the semiconductor apparatus 100 to 103 according to Embodiments 1 to 4 are applied to constitute the switching elements and the reflux diodes of the main conversion circuit 301, so that heat dissipation can be secured.

In the present embodiment, an example in which the present disclosures applied to a two-level three-phase inverter is described, but the present disclosure is not limited thereto and can be applied to various power converters. Instead of the two-level power converter, the present disclosure can be applied to a multilevel power converter with three levels or higher levels. Further, the present disclosure may be applied to a single-phase inverter if the power is applied to a single-phase load. In addition, the present disclosure can be applied to a DC/DC converter or an AC/DC converter if the load is a DC load or the like.

The application of the power converter according to the present disclosure is not limited to the case where the load is an electric motor described above, and also includes a power supply device for an electric discharge machine, a laser processing machine, an induction heating cooker, and a non-contact power supply system, and further includes a power conditioner for a photovoltaic power generation system and a power storage system.

Note that, to the extent that the present disclosure does not depart from its gist, a plurality of components disclosed in Embodiments 1 through 5 may be combined as appropriate.

DESCRIPTION OF REFERENCE NUMERALS AND SIGNS

1 semiconductor device, 2 lead frame, 3 insulating layer, 4 metal base plate, 5 sealing member, 6 support frame, 7 heat dissipating member, 8 bonding layer, 9 wire, 10 external housing, 11 screw, 12 mold, 100, 101, 102, 103, 302 semiconductor apparatus, 200 power supply, 300 power converter, 301 main conversion circuit, 303 control circuit, 400 load

The invention claimed is:
1. A semiconductor apparatus comprising:
 a semiconductor device;

a lead frame to which the semiconductor device is bonded;

an insulating layer on which the lead frame is provided;

a metal base plate provided on a face of the insulating layer opposite to a face on which the lead frame is provided;

a sealing member to seal the semiconductor device, the lead frame, the insulating layer, and the metal base plate in such a way that a portion of the lead frame and at least one portion of the metal base plate are exposed;

a support frame having at least one opening in which the at least one exposed portion of the metal base plate exposed from the sealing member is inserted; and a heat dissipating member that is provided with multiple fins formed by folding a metal plate and that is welded to a part of the at least one exposed portion of the metal base plate inserted in the at least one opening and to the support frame.

2. The semiconductor apparatus according to claim 1, wherein the heat dissipating member includes flat portions each provided between the fins, each of the flat portions being bonded to either the metal base plate or the support frame.

3. The semiconductor apparatus according to claim 2, wherein each of the flat portions of the heat dissipating member is thinner than the metal base plate and the support frame.

4. The semiconductor apparatus according to claim 2, wherein the support frame is provided so as not to be in contact with the sealing member.

5. The semiconductor device according to claim 2, wherein the metal base plate is provided with at least two step faces parallel to a face on which the insulating layer is provided, between the face on which the insulating layer is provided and a face on which the heat dissipating member is to be bonded, in such a way that the face on which the insulating layer is provided is wider than the face on which the heat dissipating member is to be bonded.

6. The semiconductor apparatus according to claim 2, wherein the support frame has a plurality of the openings and the exposed portions of the metal base plate exposed from the sealing member are inserted in the respective openings.

7. The semiconductor apparatus according to claim 2, wherein the metal base plate and the at least one opening of the support frame are tapered from the insulating layer side toward the heat dissipating member side.

8. The semiconductor apparatus according to claim 2, wherein the support frame is an electrically conductive member to be attached to a grounded external housing.

9. The semiconductor apparatus according to claim 2, wherein the metal base plate and the heat dissipating member are each made of a metal of the same kind.

10. A power converter comprising:

a main conversion circuit including a semiconductor apparatus according to claim 2, to convert inputted electric power and output the converted electric power;

a control circuit to output to the main conversion circuit, a control signal for controlling the main conversion circuit.

11. The semiconductor apparatus according to claim 1, wherein the support frame is provided so as not to be in contact with the sealing member.

12. The semiconductor device according to claim 11, wherein the metal base plate is provided with at least two step faces parallel to a face on which the insulating layer is provided, between the face on which the insulating layer is provided and a face on which the heat dissipating member is to be bonded, in such a way that the face on which the insulating layer is provided is wider than the face on which the heat dissipating member is to be bonded.

13. The semiconductor apparatus according to claim 11, wherein the support frame has a plurality of the openings and the exposed portions of the metal base plate exposed from the sealing member are inserted in the respective openings.

14. The semiconductor device according to claim 1, wherein the metal base plate is provided with at least two step faces parallel to a face on which the insulating layer is provided, between the face on which the insulating layer is provided and a face on which the heat dissipating member is to be bonded, in such a way that the face on which the insulating layer is provided is wider than the face on which the heat dissipating member is to be bonded.

15. The semiconductor apparatus according to claim 1, wherein the support frame has a plurality of the openings and the exposed portions of the metal base plate exposed from the sealing member are inserted in the respective openings.

16. The semiconductor apparatus according to claim 1, wherein the metal base plate and the at least one opening of the support frame are tapered from the insulating layer side toward the heat dissipating member side.

17. The semiconductor apparatus according to claim 1, wherein the support frame is an electrically conductive member to be attached to a grounded external housing.

18. The semiconductor apparatus according to claim 1, wherein the metal base plate and the heat dissipating member are each made of a metal of the same kind.

19. A power converter comprising:

a main conversion circuit including a semiconductor apparatus according to claim 1, to convert inputted electric power and output the converted electric power;

a control circuit to output to the main conversion circuit, a control signal for controlling the main conversion circuit.

20. A manufacturing method for a semiconductor apparatus, comprising:

bonding a semiconductor device to a lead frame;

forming a sealing member, after stacking in a mold, a metal base plate, an insulating layer, and the lead frame to which the semiconductor device is bonded, to seal the semiconductor device, the lead frame, the insulating layer, and the metal base plate in such a way that a portion of the lead frame and a portion of the metal base plate are exposed from the sealing member;

and, after inserting the portion of the metal base plate exposed from the sealing member into an opening of a support frame, welding a heat dissipating member having multiple fins formed by folding a metal plate to both the support frame and a part of the portion of the metal base plate exposed from the sealing member and inserted into the opening.

\* \* \* \* \*